United States Patent
Dewdney

(10) Patent No.: US 9,880,237 B2
(45) Date of Patent: Jan. 30, 2018

(54) MRI SCANNER

(71) Applicant: Andrew Dewdney, Neunkirchen am Brand (DE)

(72) Inventor: Andrew Dewdney, Neunkirchen am Brand (DE)

(73) Assignee: Siemens Aktiengesellschaft, München (DE)

( * ) Notice: Subject to any disclaimer, the term of this patent is extended or adjusted under 35 U.S.C. 154(b) by 741 days.

(21) Appl. No.: 14/038,370

(22) Filed: Sep. 26, 2013

(65) Prior Publication Data

US 2014/0084917 A1    Mar. 27, 2014

(30) Foreign Application Priority Data

Sep. 27, 2012  (DE) .......................... 10 2012 217 594

(51) Int. Cl.
    *G01R 33/34*     (2006.01)
    *G01R 33/38*     (2006.01)
    *G01R 33/565*    (2006.01)

(52) U.S. Cl.
    CPC ..... *G01R 33/3403* (2013.01); *G01R 33/3804* (2013.01); *G01R 33/56563* (2013.01)

(58) Field of Classification Search
    CPC ............ G01R 33/3804; G01R 33/3403; G01R 33/3856; G01R 33/31; G01R 33/56563
    See application file for complete search history.

(56) References Cited

U.S. PATENT DOCUMENTS

| | | | |
|---|---|---|---|
| 4,663,592 A | 5/1987 | Yamaguchi et al. | |
| 7,209,778 B2 | 4/2007 | Dean et al. | |
| 2003/0137299 A1 | 7/2003 | Ham et al. | |
| 2003/0164702 A1 | 9/2003 | Bechtold et al. | |
| 2004/0064031 A1* | 4/2004 | Dean .................. | G01R 33/3804 600/410 |
| 2005/0030028 A1* | 2/2005 | Clarke ............... | G01R 33/3403 324/318 |
| 2007/0096734 A1* | 5/2007 | Lukens .................. | G01R 33/34 324/315 |
| 2008/0278175 A1* | 11/2008 | Wexler ...................... | G01K 1/14 324/546 |
| 2009/0015258 A1* | 1/2009 | Nozaki ............. | G01R 33/3856 324/315 |
| 2009/0140735 A1 | 6/2009 | Chen et al. | |

(Continued)

FOREIGN PATENT DOCUMENTS

JP     2005288025 A     10/2005

OTHER PUBLICATIONS

German Summons to Interview for related German Application No. 10 2012 217 594.6, mailed Mar. 16, 2015 with English Translation.

(Continued)

*Primary Examiner* — Clayton E Laballe
*Assistant Examiner* — Ruifeng Pu
(74) *Attorney, Agent, or Firm* — Lempia Summerfield Katz LLC

(57) ABSTRACT

A magnetic resonance imaging (MRI) scanner includes a control device, a gradient coil for generating a gradient field, a gradient coil connector for connecting the gradient coil to the control device, and a temperature sensor. The temperature sensor is configured and disposed to detect a temperature of the gradient coil connector.

7 Claims, 1 Drawing Sheet

(56) References Cited

U.S. PATENT DOCUMENTS

| | | | |
|---|---|---|---|
| 2010/0188082 A1* | 7/2010 | Morich | G01R 33/3806 |
| | | | 324/307 |
| 2012/0001635 A1* | 1/2012 | Ookawa | A61B 5/055 |
| | | | 324/314 |
| 2014/0239950 A1* | 8/2014 | Ookawa | G01R 33/543 |
| | | | 324/309 |
| 2014/0249401 A1* | 9/2014 | Van Den Brink | G01R 33/28 |
| | | | 600/410 |
| 2015/0049782 A1* | 2/2015 | Karlquist | G01R 21/02 |
| | | | 374/32 |
| 2015/0123661 A1* | 5/2015 | Yui | G01R 33/3856 |
| | | | 324/318 |

OTHER PUBLICATIONS

German Office Action cited in German Application No. 10 2012 217 594.6, dated May 17, 2013.

Zaitsev M., "Rapid eddy current calibration and prospective distortion correction methods for diffusion-weighted MRI", Proc. Intl. Soc. Mag. Reson. Med., 2005, No. 13, p. 502; 2005.

* cited by examiner

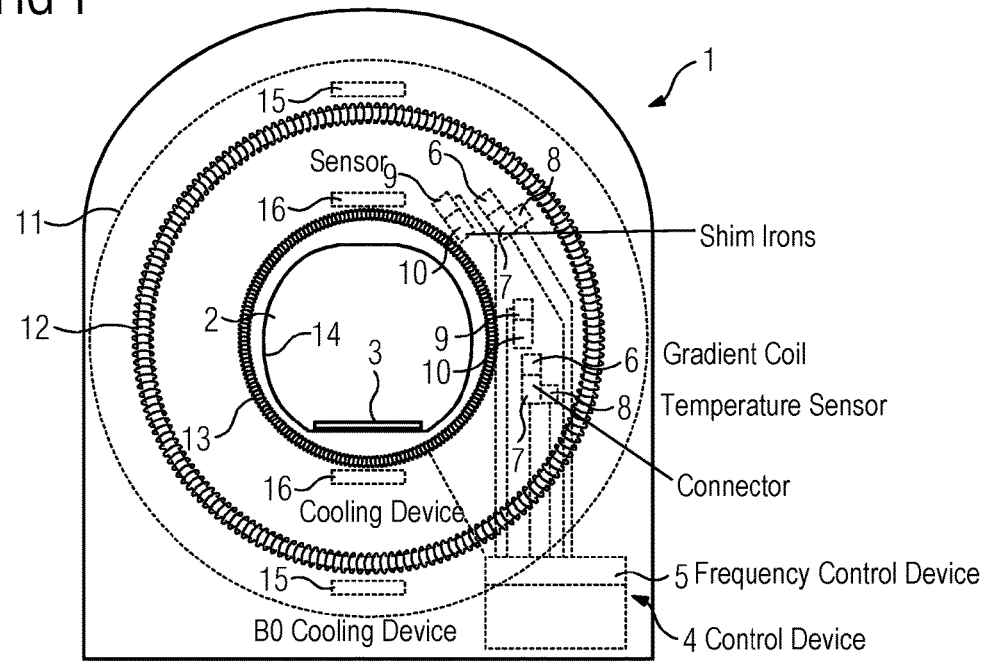

MRI SCANNER

This application claims the benefit of DE 10 2012 217 594.6, filed on Sep. 27, 2012, which is hereby incorporated by reference.

BACKGROUND

The present embodiments relate to a magnetic resonance imaging (MRI) scanner having a device for compensating temperature fluctuations, and to a corresponding method.

MRI scanners are based on measuring the resonance behavior of nuclear spins in external magnetic fields and are therefore also known as nuclear magnetic resonance imaging scanners. The basic principle of MRI involves a static magnetic field (e.g., B0 field) for aligning the nuclear spins and adjusting the rotation frequency of the nuclear spins, and a time variable magnetic field (e.g., B1 magnetic field) for flipping the nuclear spins. In order to examine the resonance behavior of the nuclear spins, the reaction over time to transient deflections caused by the transiently variable magnetic fields (e.g., gradient fields) is also measured.

The time variable B1 magnetic field allows spatial assignment of the detected signals as the basis for three-dimensional acquisition and imaging. The time variable B1 magnetic field is produced by a B1 coil arrangement that generates a signal of constant frequency (e.g., 123.1 MHz). The correlation between B1 frequency and B0 magnetic field strength is critical for the spatial resolution in MRI scans, so that, to maximize the spatial resolution, the correlation is to be kept as constant as possible or is to be known as precisely as possible.

Gradient fields are generated by gradient coils that enable the desired magnetic fields and time characteristics to be produced with minimum distortion and maximum stability. Demanding MRI sequences (e.g., time characteristics of gradient fields) such as functional MRI (fMRI), fat-saturation imaging (FATSAT) or single voxel spectroscopy (SVS), for example, place extremely exacting requirements in terms of the non-distortion of the magnetic fields and the timing.

Magnetic fields may be distorted by, among other things, eddy currents that are induced in the magnet arrangements by time varying magnetic fields (e.g., gradient fields or gradient pulses). Time characteristics of magnetic fields (e.g., frequency and phase) may be skewed by, among other things, temperature fluctuations of the coils (e.g., gradient coils) and of other magnetically active components present in the magnetic field. Distortions of the magnetic fields (e.g., also of the static field) may also be caused by magnetically active bodies in the MRI scanner or in the vicinity of the MRI scanner (e.g., ferromagnetic metal bodies of the housing and of the functional components of the MRI scanner). Insofar as the causes of the distortions are static, the causes of the distortions may be compensated or reduced my mounting shim irons.

Distortions of the magnetic fields may have dynamic causes (e.g., changing magnetic fields). The publication "Rapid eddy current calibration and prospective distortion correction methods for diffusion-weighted MRI," by M. Zaitsev, J. Hennig, and O. Speck, in Proc. Intl. Soc. Mag. Reson. Med. 13 (2005), discloses a method known as MESON for compensating distortions of magnetic fields caused by induced eddy currents in MRI.

Non-static distortions may be caused by unwanted temperature variations occurring during operation of the MRI scanner. Changes in the temperature of the scanner components cause the magnetic properties to change. As the components of a scanner generally heat up during operation, temperature-dependent magnetic field distortions are unavoidable, causing, for example, the static B0 magnetic field to become distorted. This results in changes in the strength of the B0 magnetic field that cause changes in the correlation between B0 field strength and B1 field frequency.

The publication US 2009/0140735 A1 therefore discloses an MRI scanner having a coil fitted with a heater and temperature sensor. The coil is heated to a controlled, constant temperature in order to eliminate temperature fluctuations. The need to continuously heat the coil adversely affects energy consumption, as the additional coils of the MRI scanner may be of the superconducting type and therefore are to be deeply cooled.

The publication US 2003/0164702 A1 discloses an MRI scanner that incorporates shim irons or shims that are configured to increase the homogeneity of the magnetic fields. The shim irons are disposed on the gradient coils. During operation of the scanner, the shim irons are subject to temperature fluctuations caused by magnetic fields and heating of the gradient coils. The magnetic properties of the shim irons are temperature-dependent. It is therefore proposed to keep the shim irons at constant temperature by controlled heating. As mentioned above, the heating device disadvantageously affects energy consumption.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a magnetic resonance imaging (MRI) scanner having a device for compensating temperature fluctuations, and a corresponding method may reduce unwanted effects of temperature fluctuations on imaging.

An MRI scanner includes a control device, a B0 coil arrangement, a B1 coil arrangement, a cooling device for cooling components of the MRI scanner, and a temperature sensor. The temperature sensor is configured and arranged to measure the temperature of a not directly cooled component of the MRI scanner. Temperature fluctuations of the not directly cooled components of the MRI scanner correlate particularly strongly with temperature-dependent distortions of the magnetic fields (e.g., more strongly than shim iron temperature fluctuations).

One embodiment provides that a gradient coil for generating a gradient field is incorporated, and a gradient coil connector connects the gradient coil to the control device. The temperature sensor is configured and arranged to measure the temperature of the gradient coil connector. The gradient coil connector constitutes an advantageous mounting position where a temperature sensor may be disposed without complexity and not directly in and therefore disturbing the gradient field.

Another embodiment provides that a casing for accommodating the B0 coil arrangement is incorporated, and the temperature sensor is configured and arranged to measure the temperature of the casing. The casing includes an advantageous mounting position where a temperature sensor may be disposed uncomplicatedly and not directly in and therefore disturbing the gradient field.

Another embodiment provides that a tube bore is incorporated, and the temperature sensor is configured and arranged to measure the temperature of the tube bore. The tube bore includes an advantageous mounting position where a temperature sensor may be disposed uncomplicatedly and not directly in and therefore disturbing the gradient field.

An embodiment provides that the control device also includes a frequency control device connected to the B1 coil arrangement and configured to control the B1 frequency of the magnetic field generated by the B1 coil arrangement. The frequency control device is connected to the temperature sensor in order to receive a temperature signal from the temperature sensor. Directly connecting the temperature sensor to the frequency control device enables temperature fluctuations to be taken into account right from the outset during frequency control of the B1 magnetic field in order to achieve better compensation of temperature-dependent field distortions and improved imaging quality of the MRI scanner.

Another embodiment provides that the frequency control device is configured to control a frequency as a function of the connector temperature signal. The frequency of the gradient field critically affects the achievable imaging quality of the MRI scanner. Frequency control as a function of the connector temperature signal therefore allows particularly effective compensation of temperature-dependent fluctuations affecting imaging quality.

Another embodiment provides that the frequency control device is configured to make the frequency proportional to the temperature signal (e.g., with a proportionality factor of 16.6 to 30). A proportional relationship exists between the temperature signal and the undesirable temperature-dependent frequency drift of the nuclear spin due to the temperature-dependent distortion of the B0 magnetic field. Inexpensive compensation of the frequency drift may be achieved by shifting the B1 frequency proportionally to the temperature signal.

Another embodiment provides that the frequency control device is configured to generate the frequency additionally using a predetermined additive constant (e.g., offset).

Another embodiment provides that a shim iron and a shim temperature sensor are additionally incorporated. The shim temperature sensor is configured and disposed to measure the shim iron temperature. In addition to temperature fluctuations of not directly cooled components of the MRI scanner, shim iron temperature fluctuations also correlate with frequency drifts of the gradient field. Knowledge of the shim temperature may therefore also be used to improve the compensation of temperature-dependent fluctuations still further.

Another embodiment provides that a shim iron and a shim temperature sensor are also incorporated. The shim temperature sensor is configured and disposed to measure the shim iron temperature. The frequency control device is connected to the shim temperature sensor in order to receive from the shim temperature sensor a shim temperature signal dependent on the shim iron temperature. By additionally connecting the shim temperature sensor directly to the frequency control device, temperature fluctuations of the shim iron may also be taken into account from the outset during frequency control of the gradient field in order to achieve improved imaging quality of the MRI scanner.

Another embodiment provides that the frequency control device is configured to control a frequency as a function of the temperature signal of a not directly cooled component of the MRI scanner and of the shim temperature signal. The frequency of the gradient field critically affects the achievable imaging quality of the MRI scanner. Frequency control additionally dependent on the shim temperature signal therefore enables an additional improvement of the compensation of temperature-dependent fluctuations in imaging quality to be achieved.

A method for controlling an MRI scanner having directly and not directly cooled components includes generating a control signal for a B1 coil arrangement, measuring a temperature of a not directly cooled component of the MRI scanner (e.g., of a gradient coil connector, a tube bore, or a casing), and generating the control signal as a function of the measured temperature.

Temperature fluctuations of not directly cooled components of the MRI scanner (e.g., of a gradient coil connector, a tube bore, or a casing) correlate particularly strongly with temperature-dependent distortions of the magnetic fields (e.g., more strongly than shim iron temperature fluctuations). By directly allowing for the temperature of not directly cooled components of the MRI scanner, temperature fluctuations may be taken into account from the outset during frequency control of the B1 magnetic field in order to achieve better compensation of temperature-dependent field distortions and an improvement in the imaging quality of the MRI scanner.

Another embodiment provides that the method includes generating the control signal such that a control signal frequency proportional to the measured temperature is generated (e.g., having a proportionality factor of 16.6 to 30).

This embodiment is based on the fact that a proportional relationship exists between the temperature signal and the undesirable temperature-dependent frequency drift of the nuclear spin due to the temperature-dependent distortion of the B0 magnetic field. Inexpensive compensation of the frequency drift may be achieved by shifting the frequency proportionally to the temperature signal.

Another embodiment provides that the method also includes measuring the temperature of a shim iron and generating a control signal that is additionally dependent on the shim temperature.

In addition to temperature fluctuations of not directly cooled components, shim iron temperature fluctuations also correlate with frequency drifts of the gradient field. Knowledge of the shim temperature may therefore be used to improve the compensation of temperature-dependent fluctuations in the imaging quality still further. By additionally allowing for the shim temperature, temperature fluctuations of the shim iron may additionally be taken into account from the outset during frequency control of the B1 magnetic field in order to achieve better compensation of temperature-dependent field distortions and an improvement in the imaging quality of the MRI scanner.

BRIEF DESCRIPTION OF THE DRAWINGS

FIG. 1 shows one embodiment of a magnetic resonance imaging (MRI) scanner with a temperature sensor for a gradient coil connector, and a shim temperature sensor; and FIG. 2 shows one embodiment of an MRI scanner with a temperature sensor for a gradient coil connector.

DETAILED DESCRIPTION

FIG. 1 schematically illustrates one embodiment of a magnetic resonance imaging (MRI) scanner 1. The MRI scanner 1 has a tunnel 2 into which a patient or body to be examined is slid. Additionally provided is a table 3 on which the patient or body may be positioned and slid into or out of the tunnel 2. A casing 11 is disposed around the tunnel 2 and has a central opening known as a tube bore 14. The casing 11 encloses a B0 coil arrangement 12 for generating the static B0 magnetic field. The B0 coil arrangement 12 may be constituted by a high temperature superconductor and is directly cooled by a B0 cooling device 15. A B1 coil arrangement 13 for generating a time-varying B1 magnetic field is also provided.

Mounted in and on the MRI scanner 1 are numerous MRI scanner components not essential for explaining the embodiments that, for the sake of clarity, are not shown or explained. A control device 4 that controls the generation of gradient fields is additionally located inside the MRI scanner 1. The control device 4 includes a frequency control device 5 that controls frequency-related parameters of the gradient fields to be generated.

The gradient coils 6 are connected to the control device 4 and frequency control device 5. For direct cooling of the gradient coils 6, a gradient cooling device 16 is provided. The gradient coils 6 are used to generate gradient fields. The control device 4 controls the generation of gradient fields by controlling the gradient coils 6.

The gradient coils 6 are electrically connected to the control device 4 by not directly cooled gradient coil connectors 7. The control signals of the control device 4 for controlling the gradient coils 6 (e.g., for controlling the coil current) are transmitted via the gradient coil connectors 7.

Disposed on the gradient coil connectors 7 are temperature sensors 8. The temperature sensors 8 detect a signal dependent on the temperature of the not directly cooled gradient coil connectors 7. The temperature sensors 8 are of conventional design (e.g., based on thermoresistive resistors, optical measuring elements, or semiconductors). The temperature sensors 8 are connected to the control device 4 and generate a connector temperature signal as a function of the temperature of the gradient coil connectors 7.

The connector temperature signal is received by the control device 4 and used to control the B1 coil arrangement 13. The control device 4 uses the connector temperature signal to compensate temperature-dependent frequency drift of the nuclear spins caused by temperature-dependent variations in the B0 magnetic field by creating a frequency in the signal to control the B1 coil arrangement 13 as a function of the connector temperature signal. As a result, the correlation between the frequency of the B1 magnetic field and the strength of the B0 magnetic field is kept constant. The frequency in the control signal may be shifted proportionally to the connector temperature. If the temperature sensors 8 produce a temperature-proportional connector temperature signal, the frequency in the control signal is therefore varied proportionally to the connector temperature signal. The frequency in the control signal may be varied proportionally to the connector temperature with a factor of between 16.6 and 30. If required, a constant absolute value (e.g., an offset) is added to the frequency change.

Temperature-dependent frequency drifts of the nuclear spins dependent on the B0 magnetic field may be reduced from 200 Hz per hour to values of 10-20 Hz, thereby enabling variations in subsequent image reconstruction to be prevented.

The proportionality with respect to temperature exists both during heating of the MRI scanner 1, or more specifically, of the gradient coil connectors 7, and during cooling. This makes another embodiment possible in which the temperature and frequency characteristics are recorded in the heating phase, and therefore, scaling factors (e.g., proportionality factors) are calibrated. The calibrated scaling factors are then available for the subsequent cooling phase. Therefore, in the cooling phase, the frequency of the B1 magnetic field may be controlled according to the calibration curve obtained in the heating phase.

The gradient coils 6 are provided with shim irons 10 to improve the homogeneity of the magnetic fields. The temperature of the shim irons is detected by shim temperature sensors 9. The shim temperature signal of the shim temperature sensors 9 is likewise fed to the control device 4. The control device 4 varies the signal for controlling the gradient coils 6 additionally as a function of the shim temperature signal. As a result, the negative effect of temperature fluctuations on the quality of the gradient fields to be generated may be reduced still further.

FIG. 2 schematically illustrates one embodiment of an MRI scanner 21. The MRI scanner 21 includes a tunnel 22 and associated positioning table 23. A control device 24 with frequency control device 25 is disposed inside the MRI scanner 21. The control device 24 is connected to gradient coils 26. Disposed on the gradient coils 26 are gradient coil connectors 27. A temperature of the gradient coil connectors 27 is detected by temperature sensors 28. The temperature sensors 28 are connected to the control device 24. A casing 41 with tube bore 44, and a B0 coil arrangement 42 disposed in the casing 41 and directly cooled by a B0 cooling device 45 are also provided. The gradient coils 26 are directly cooled by a gradient cooling device 46. A B1 coil arrangement 43 for generating a B1 magnetic field is additionally provided. With respect to the interaction of the components, reference is made to the description of the previous figure.

The MRI scanner 21 also includes shim irons 30 that are disposed on the gradient coils 26. In contrast to the exemplary embodiment explained above, no sensors for detecting the shim temperature are provided on the shim irons 30. The control device 24 accordingly receives no shim temperature signal. A frequency in the control signal for the gradient coils 26 is therefore varied exclusively on the basis of the connector temperature signal.

In one or more of the present embodiments, an MRI scanner having a device for compensating temperature fluctuations, and a corresponding method are provided. The MRI scanner includes a device for compensating temperature fluctuations. A corresponding method is provided. Disturbing effects of temperature fluctuations of the magnet system on the homogeneity of the magnetic field are reduced, and therefore, the imaging quality is improved. The MRI scanner 1,11 includes a control device 4,24, a gradient coil 6,26 for generating a gradient field, a gradient coil connector 7,27 for connecting the gradient coil 6,26 to the control device 4,24, and a temperature sensor 8,28. The temperature sensor 8,28 is configured and disposed to detect the temperature of the gradient coil connector 7,27. Temperature fluctuations of the gradient coil connector correlate particularly strongly with temperature-dependent distortions of the magnetic fields (e.g., more strongly than shim iron temperature fluctuations). In addition, the gradient coil connector constitutes an advantageous mounting position where a temperature sensor may be disposed without complexity and not directly and therefore disturbingly in the gradient field. Therefore, with knowledge of the connector temperature, temperature-dependent fluctuations of the gradient field may be compensated or eliminated from the outset in order to improve the image quality.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance imaging (MRI) scanner comprising:
   a control device comprising a frequency control device;
   a B0 coil arrangement;
   a B1 coil arrangement;
   a gradient coil for generating a gradient field;
   a gradient coil connector for connecting the gradient coil to the control device;
   a tube bore;
   a cooling device for directly cooling components of the MRI scanner, the cooling device not directly cooling the gradient coil connector or the tube bore; and
   a temperature sensor, wherein the temperature sensor is configured and disposed to detect a temperature of the gradient coil connector or the tube bore,
   wherein the frequency control device is connected to the B1 coil arrangement and is configured to control a B1 frequency of a magnetic field generated by the B1 coil arrangement, and
   wherein the frequency control device is connected to the temperature sensor to receive a temperature signal from the temperature sensor.

2. The MRI scanner as claimed in claim 1, further comprising a casing for accommodating the B0 coil arrangement.

3. The MRI scanner as claimed in claim 1, wherein the frequency control device is configured to control the B1 frequency as a function of the temperature signal.

4. The MRI scanner as claimed in claim 3, wherein the frequency control device is configured to generate the frequency proportionally to the temperature signal.

5. The MRI scanner as claimed in claim 4, wherein the frequency control device is configured to generate the frequency proportionally to the temperature signal with a proportionality factor of 16.6 to 30.

6. The MRI scanner as claimed in claim 4, wherein the frequency control device is configured to generate the frequency additionally with a predetermined additive constant.

7. A method for controlling a magnetic resonance imaging (MRI) scanner having directly cooled and not directly cooled components, the method comprising:
   generating a control signal for a B1 coil arrangement; and
   detecting a temperature of a gradient coil connector or a tube bore,
   wherein the generating comprises generating the control signal as a function of the detected temperature, a frequency of the control signal being formed as a function of the detected temperature,
   wherein the generating further comprises generating the control signal such that a frequency of the control signal is generated proportionally to the detected temperature, and
   wherein the generating further comprises generating the control signal such that the frequency of the control signal is generated proportionally to the detected temperature using a proportionality factor of 16.6 to 30.

* * * * *